United States Patent
Hagleitner et al.

(10) Patent No.: US 9,202,703 B2
(45) Date of Patent: Dec. 1, 2015

(54) NI-RICH SCHOTTKY CONTACT

(71) Applicant: Cree, Inc., Durham, NC (US)

(72) Inventors: Helmut Hagleitner, Zebulon, NC (US); Fabian Radulescu, Chapel Hill, NC (US); Daniel Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/668,540

(22) Filed: Nov. 5, 2012

(65) Prior Publication Data

US 2014/0124792 A1 May 8, 2014

(51) Int. Cl.
| | |
|---|---|
| *H01L 29/84* | (2006.01) |
| *H01L 21/285* | (2006.01) |
| *H01L 29/47* | (2006.01) |
| *H01L 29/423* | (2006.01) |
| *H01L 29/778* | (2006.01) |
| H01L 29/20 | (2006.01) |

(52) U.S. Cl.
CPC .... *H01L 21/28581* (2013.01); *H01L 29/42316* (2013.01); *H01L 29/475* (2013.01); *H01L 29/7787* (2013.01); *H01L 29/2003* (2013.01)

(58) Field of Classification Search
USPC .......... 257/254, 260, 267, 280, 471, E33.051, 257/E31.074, E27.068, E29.041, E29.148, 257/E29.178, E29.271
See application file for complete search history.

(56) References Cited

U.S. PATENT DOCUMENTS

| | | | |
|---|---|---|---|
| 5,459,087 A | 10/1995 | Mochizuki | |
| 5,631,479 A | 5/1997 | Shiga | |
| 8,035,130 B2 | 10/2011 | Nanjo et al. | |
| 2005/0151255 A1 | 7/2005 | Ando et al. | |
| 2006/0157735 A1* | 7/2006 | Kanamura et al. | 257/194 |
| 2007/0158683 A1 | 7/2007 | Sheppard et al. | |

(Continued)

FOREIGN PATENT DOCUMENTS

| | | |
|---|---|---|
| JP | 61290775 | 12/1986 |
| JP | 2008117874 A | 5/2008 |
| JP | 2011238805 A | 11/2011 |

OTHER PUBLICATIONS

Hashizume, Tamotsu et al., "Surface Control Process of AlGaN for Suppression of Gate Leakage Currents in AlGaN/GaN Heterostructure Field Effect Transistors", Japanese Journal of Applied Physics, 2006, pp. L111-L113, vol. 45, No. 4.

(Continued)

*Primary Examiner* — Timor Karimy
(74) *Attorney, Agent, or Firm* — Myers Bigel Sibley & Sajovec, P.A.

(57) ABSTRACT

Embodiments of a Nickel-rich (Ni-rich) Schottky contact for a semiconductor device and a method of fabrication thereof are disclosed. Preferably, the semiconductor device is a radio frequency or power device such as, for example, a High Electron Mobility Transistor (HEMT), a Schottky diode, a Metal Semiconductor Field Effect Transistor (MESFET), or the like. In one embodiment, the semiconductor device includes a semiconductor body and a Ni-rich Schottky contact on a surface of the semiconductor body. The Ni-rich Schottky contact includes a multilayer Ni-rich contact metal stack. The semiconductor body is preferably formed in a Group III nitride material system (e.g., includes one or more Gallium Nitride (GaN) and/or Aluminum Gallium Nitride (AlGaN) layers). Because the Schottky contact is Ni-rich, leakage through the Schottky contact is substantially reduced.

28 Claims, 8 Drawing Sheets

(56) References Cited

U.S. PATENT DOCUMENTS

| | | | |
|---|---|---|---|
| 2008/0290371 | A1 | 11/2008 | Sheppard et al. |
| 2009/0057718 | A1 | 3/2009 | Suvorov et al. |
| 2009/0078966 | A1 | 3/2009 | Asai et al. |
| 2010/0038680 | A1 | 2/2010 | Nakayama et al. |
| 2011/0057232 | A1 | 3/2011 | Sheppard et al. |
| 2011/0101377 | A1 | 5/2011 | Suvorov et al. |
| 2011/0156051 | A1* | 6/2011 | Green et al. .................. 257/76 |
| 2013/0082307 | A1* | 4/2013 | Okamoto et al. ............. 257/279 |

OTHER PUBLICATIONS

Liu, Q.Z. et al., "Ni and Ni Silicide Schottky Contacts on n—GaN", Journal of Applied Physics, Jul. 15, 1998, pp. 881-886, vol. 84, No. 2.

International Search Report for PCT/US2013/026342, mailed Jun. 12, 2013, 12 pages.

Non-Final Office Action for U.S. Appl. No. 13/414,286, mailed Sep. 24, 2013, 11 pages.

Chen, C.P. et al., "Enhancement of Schottky Barrier Height to n—GaAs Using NiAl, NiAl/Al/Ni, and Ni/Al/Ni Layer Structures," Journal of Vacuum Science and Technology, vol. 12, No. 4, Pt. II, Jul. 1, 1994, pp. 1915-1919.

Readinger, E.D. et al., "Thermal Stability of Metallizations on GaN/AlxGa1-xN/GaN Heterostructures," Semiconductor Science and Technology, vol. 20, No. 5, May 1, 2005, pp. 389-397.

Venugopalan, H.S. et al., "Approaches to Designing Thermally Stable Schottky Contacts to n—GaN," Semiconductor Science Technology, vol. 14, No. 9, Sep. 1, 1999, pp. 757-761.

Invitation to Pay Additional Fees for PCT/US2013/067206, mailed Dec. 12, 2013, 8 pages.

Final Office Action for U.S. Appl. No. 13/414,286, mailed Mar. 11, 2014, 9 pages.

Advisory Action for U.S. Appl. No. 13/414,286, mailed Jun. 5, 2014, 3 pages.

International Search Report and Written Opinion for PCT/US2013/067206, mailed Mar. 7, 2014, 17 pages.

International Preliminary Report on Patentability for PCT/US2013/026342, mailed Sep. 18, 2014, 8 pages.

Venugopalan, H.S. et al., "Interfacial reactions between nickel thin films and GaN," Journal of Applied Physics, vol. 82, No. 2, Jul. 15, 1997, 5 pages.

Written Opinion for PCT/US2013/067206 mailed Nov. 25, 2014, 12 pages.

International Preliminary Report on Patentability for PCT/US2013/067206, mailed Jan. 21, 2015, 7 pages.

Examiner's Answer to the Appeal Brief for U.S. Appl. No. 13/414,286, mailed Mar. 26, 2015, 12 pages.

* cited by examiner

NI-RICH SCHOTTKY CONTACT

FIELD OF THE DISCLOSURE

The present disclosure relates to a Nickel (Ni) rich Schottky contact for a semiconductor device.

BACKGROUND

Semiconductor devices such as High Electron Mobility Transistors (HEMTs), Schottky diodes, Metal Semiconductor Field Effect Transistors (MESFETS) and the like employ a Schottky contact. Schottky contacts are generally metal contacts that are formed on a semiconductor material to create a metal-semiconductor junction that tends to provide a rectifying effect due to an inherent potential barrier that is formed at the metal-semiconductor junction.

A Schottky contact may be created by forming one or more metal layers on a surface of a semiconductor body where the Schottky contact is desired. For example, a Schottky gate contact for a HEMT may be formed on the semiconductor body and between corresponding source and drain contacts. If the semiconductor material on which the HEMT's Schottky gate contact is formed includes Aluminum Gallium Nitride (AlGaN), two common metals that are often used in the Schottky gate contact of the HEMT are Nickel (Ni) and Gold (Au). More specifically, a Ni layer is typically formed on the semiconductor body of the HEMT, and an Au layer is formed on the Ni layer. Other layers may be provided between the Ni and Au layers. The Ni layer forms a Schottky layer of the Schottky gate contact. Notably, Ni is often used for the Schottky layer of a Schottky contact to an AlGaN material due to the relatively high barrier height provided between Ni and AlGaN. The upper Au layer is formed at or near the top of the Schottky gate contact to form a contact layer. Use of Au for the contact layer helps to minimize resistance associated with the Schottky gate contact.

SUMMARY

The present disclosure relates to a Nickel-rich (Ni-rich) Schottky contact for a semiconductor device and method of fabrication thereof. Preferably, the semiconductor device is a radio frequency or power device such as, for example, a High Electron Mobility Transistor (HEMT), a Gallium Nitride (GaN) power switch, a Metal Semiconductor Field Effect Transistor (MESFET), or the like. In one embodiment, the semiconductor device includes a semiconductor body and a Ni-rich Schottky contact on a surface of the semiconductor body. The Ni-rich Schottky contact includes a multilayer Ni-rich contact metal stack. The semiconductor body is preferably formed in a Group III nitride material system (e.g., includes one or more GaN and/or Aluminum Gallium Nitride (AlGaN) layers). Because the Schottky contact is Ni-rich, leakage through the Schottky contact is substantially reduced.

In one embodiment, the Ni-rich contact metal stack Ni-rich Schottky contact includes a first Ni layer directly on a surface of the semiconductor body, an interlayer directly on a surface of the first Ni layer opposite the semiconductor body, and a second Ni layer directly on a surface of the interlayer opposite the first Ni layer where a ratio of a total thickness of the first and second Ni layers to a thickness of the interlayer is greater than 1, more preferably greater than 2, and even more preferably greater than 3. In one preferred embodiment, the ratio of the total thickness of the first and second Ni layers to the thickness of the interlayer is approximately 3.333. Preferably, the interlayer is a Platinum (Pt) layer. Alternatively, the interlayer is a Palladium (Pd) layer or an Iridium (Ir) layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
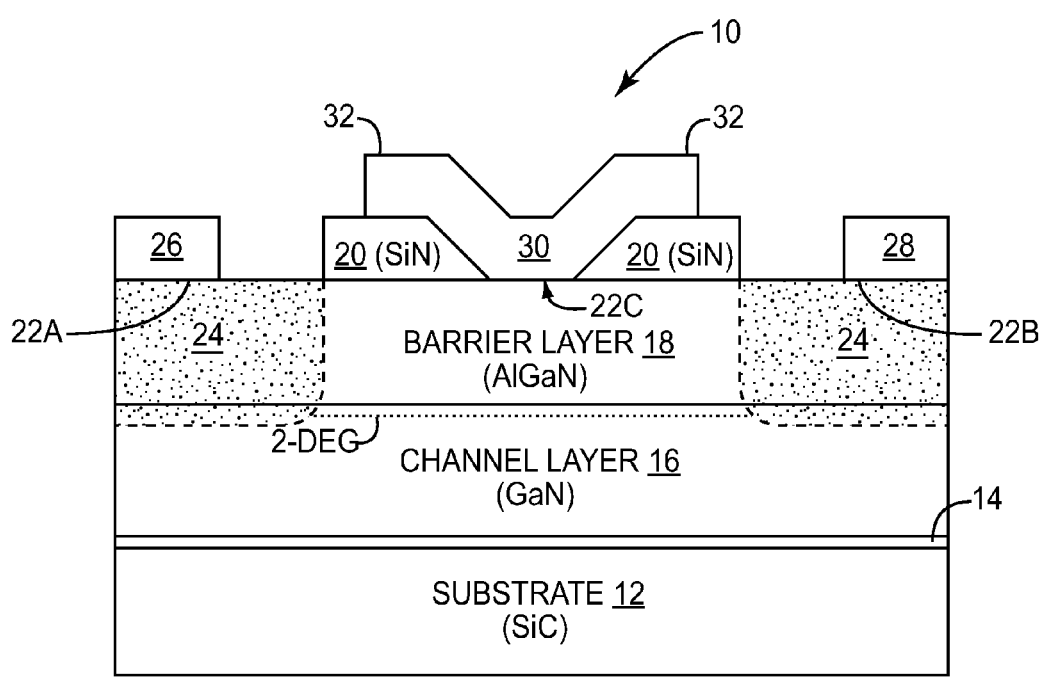
FIG. 1 illustrates a High Electron Mobility Transistor (HEMT) including a Nickel-rich (Ni-rich) Schottky contact according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As discussed in the background, a Schottky contact may be created by forming one or more metal layers on a surface of a semiconductor body where the Schottky contact is desired. The inventors have found that the various metal layers used for the Schottky contact intermix at elevated fabrication and operational temperatures and, unfortunately, this intermixing often leads to increased gate leakage, which results in early failure of the device. As such, there is a need for a Schottky contact having reduced leakage and methods of fabrication thereof.

The present disclosure describes embodiments of a Nickel-rich (Ni-rich) Schottky contact for a semiconductor device and methods of fabrication thereof. As discussed below, the Ni-rich Schottky contact results in reduced leakage. Prior to delving into the details of the Ni-rich Schottky contact of the present disclosure and exemplary techniques for fabricating the same, an overview of an exemplary High Electron Mobility Transistor (HEMT) 10 on which a Ni-rich Schottky contact may be employed according to one embodiment of the present disclosure is provided in association with FIG. 1. Note, however, that those skilled in the art will recognize the applicability to the concepts of the present disclosure for various semiconductor devices and, in particular, other radio frequency (RF) and/or power devices such as, for example, Schottky diodes, Metal Semiconductor Field Effect Devices (MESFETs), Gallium Nitride (GaN) power switches, and the like.

In the illustrated example, the HEMT 10 is formed in a Group III nitride material system on a substrate 12. In particular, the HEMT 10 is formed in a GaN/Aluminum Gallium Nitride (AlGaN) material system, and the substrate 12 is formed of Silicon Carbide (SiC). The substrate 12 is a semi-insulating substrate formed of a 4H polytype of SiC. Optional SiC polytypes include 3C, 6H, and 15R polytypes. The term "semi-insulating" is used in a relative rather than absolute sense. Alternative materials for the substrate 12 may include Sapphire, Aluminum Nitride (AlN), AlGaN, GaN, Silicon (Si), Gallium Arsenide (GaAs), Zinc Oxide (ZnO), and Indium Phosphide (InP). The substrate 12 is generally between 300 micrometers and 500 micrometers thick.

A nucleation layer 14 may be formed on a surface of the substrate 12 to provide an appropriate crystal structure transition between the SiC of the substrate 12 and the various epitaxial layers that are to be formed on the substrate 12. The nucleation layer 14 may be a single layer or a series of layers. The nucleation layer 14 is generally between 300 micrometers and 500 micrometers thick.

A channel layer 16 is formed on a surface of the nucleation layer 14 opposite the substrate 12. The channel layer 16 is formed by one or more epitaxial layers. For this example, the channel layer 16 is GaN. However, the channel layer 16 may more generally be a Group III nitride such as GaN, $Al_xGa_{1-x}N$ where $0 \leq X < 1$, Indium Gallium Nitride (InGaN), Aluminum Indium Gallium Nitride (AlInGaN), or the like. The channel layer 16 may be undoped, or at least unintentionally doped, and may be grown to a thickness of greater than about 20 Angstroms. In certain embodiments, the channel layer 16 may employ a multi-layer structure, such as a superlattice or alternating layers of different Group III-nitrides, such as GaN, AlGaN, or the like.

A barrier layer 18 is formed on the channel layer 16. The barrier layer 18 may have a bandgap that is greater than the bandgap of the underlying channel layer 16. Further, the barrier layer 18 may have a smaller electron affinity than the channel layer 16. In this illustrated embodiment, the barrier layer 18 is AlGaN; however, the barrier layer 18 may include AlGaN, AlInGaN, AlN, or various combinations of these layers. The barrier layer 18 is generally between 20 Angstroms and 400 Angstroms thick; however, the barrier layer 18 should not be so thick as to cause cracking or substantial defect formation therein. The barrier layer 18 may be either undoped, or at least unintentionally doped, or doped with an n-type dopant to a concentration less than about $1 \times 10^{19}$ centimeters $(cm)^{-3}$. Notably, together, the channel layer 16 and the barrier layer 18 form a semiconductor body of the HEMT 10.

As shown in FIG. 1, a dielectric layer 20 is formed on a surface of the barrier layer 18 opposite the channel layer 16 and is etched using known etching techniques to the shape shown. In this embodiment, the dielectric layer 20 is Silicon Nitride (SiN). However, the dielectric layer 20 may be formed of another suitable dielectric such as, for example, Silicon Dioxide ($SiO_2$), Aluminum Silicon Nitride (AlSiN), Silicon Oxynitride (SiON), or the like. It will be understood that the terms "$Si_xN_y$," "SiN," and "Silicon Nitride" are used herein interchangeably to refer to both stoichiometric and non-stoichiometric SiN. Other materials that may be used for the dielectric layer 20 include, for example, Magnesium Oxide, Scandium Oxide, Aluminum Oxide, and/or Aluminum Oxynitride. Furthermore, the dielectric layer 20 may be a single layer or may include multiple layers of uniform or non-uniform composition. The material of the dielectric layer 20 should be capable of withstanding relatively high temperatures, and should allow at least a portion to be removed without significantly damaging the underlying barrier layer 18.

In general, the dielectric layer 20 may provide a relatively high breakdown field strength and a relatively low interface trap density at the interface with an underlying Group III nitride layer such as the barrier layer 18. The dielectric layer 20 may have a high etch selectivity with respect to the material of the barrier layer 18, and may not be reactive to the material of the barrier layer 18. Moreover, the dielectric layer 20 may have a relatively low level of impurities therein. For example, the dielectric layer 20 may have a relatively low level of Hydrogen and other impurities, including Oxygen, Carbon, Fluorine, and Chlorine. The dielectric layer 20 is generally between 800 Angstroms and 2000 Angstroms thick.

As illustrated, the dielectric layer 20 is etched to expose surface portions 22A, 22B, and 22C of the barrier layer 18. The area beneath the surface portion 22A corresponds to the drain region, and the area beneath the surface portion 22B corresponds to the source region. The areas beneath the surface portions 22A and 22B, which correspond to the drain and source regions, are subjected to a "shallow implant" to form respective shallow implant regions 24, which are shown with stippling. The shallow implant regions 24 extend through the barrier layer 18 and at least partially into the channel layer 16. As such, the ions for the doping material come to rest in both the barrier layer 18 and at least the upper portion of the channel layer 16 beneath the surface portions 22A and 22B.

As used herein, the term "shallow implant" means that the implants are made directly into the barrier layer 18 with no substantive capping or protection layer over the surface portions 22A and 22B of the barrier layer 18 during implantation. The implanted ions of the doping material may be implanted such that a peak of the implant profile is located just below the interface between the channel layer 16 and the barrier layer 18 where a two-dimensional electron gas (2-DEG) plane is formed during operation and in which electron conductivity is modulated. While the doping concentrations may vary based on desired performance parameters, first exemplary doping conditions may provide shallow implant regions 24 with a peak doping concentration of $1 \times 10^{18}$ cm$^{-3}$ or greater and a straggle of 50 nanometers (nm) or less. For example, in some embodiments, the dose and energy of the implants may be selected to provide a peak doping concentration of about $5 \times 10^{19}$ cm$^{-3}$ and a straggle of about 30 nm. In order to form n-type shallow implant regions 24 in a nitride-based barrier layer 18, the implanted ions may include Si ions, Sulfur ions, Oxygen ions, or a combination thereof.

On the surface portion 22A, a drain contact 26 is formed. The drain contact 26 is an ohmic contact that cooperates with the shallow implant region 24 residing beneath the surface portion 22A to provide a low resistance connection to the drain region of the HEMT 10. Similarly, on the surface portion 22B, a source contact 28 is formed. The source contact 28 is an ohmic contact that cooperates with the shallow implant region 24 residing beneath the surface portion 22B to provide a low resistance connection to the source region of the HEMT 10. The source and drain regions connect with the opposite sides of the 2-DEG plane, which is just below the junction of the channel layer 16 and barrier layer 18.

As noted above, the dielectric layer 20 is also etched to expose the surface portion 22C of the barrier layer 18. The surface portion 22C resides between the surface portions 22A and 22B and corresponds to a gate region of the HEMT 10. A Ni-rich Schottky contact 30, or gate contact, is formed with one or more metallic layers over the surface portion 22C of the barrier layer 18. As illustrated, a portion of the Ni-rich Schottky contact 30 may be formed directly on the barrier layer 18, which itself may be formed from multiple epitaxial layers. Typically, an opening is etched through the dielectric layer 20 to expose the surface portion 22C. As illustrated, the Ni-rich Schottky contact 30 may have a portion that resides within the opening in contact with the surface portion 22C as well as portions that reside along the sidewalls of the opening and on an upper surface of the dielectric layer 20 on either side of the opening. The portions of the Ni-rich Schottky contact 30 that reside on the upper surface of the dielectric layer 20 on either side of the opening form field plates 32. The field plates 32 reduce the negative impact of nearby electromagnetic fields on the gate of the HEMT 10.

Figure 2:
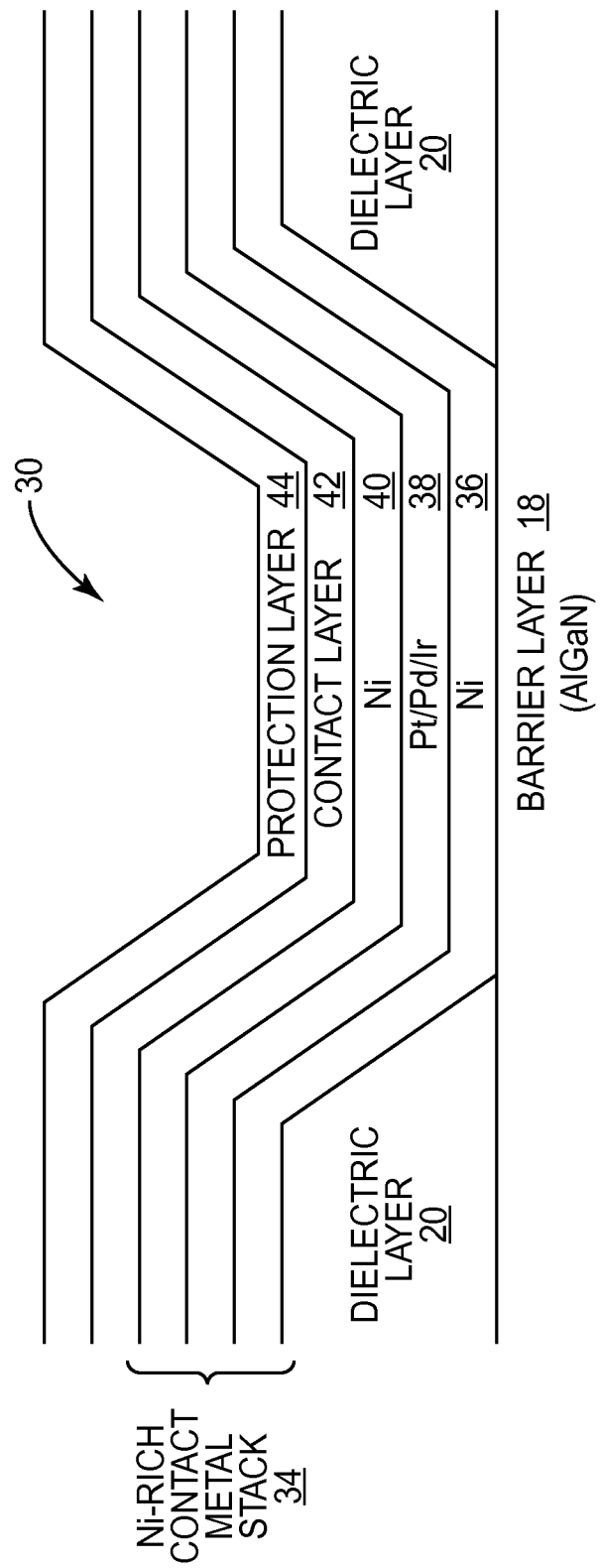
FIG. 2 illustrates the Ni-rich Schottky contact of FIG. 1 in more detail according to one embodiment of the present disclosure in which the Ni-rich Schottky contact includes a Ni-rich contact metal stack including a first Ni layer, an interlayer, and a second Ni layer.
Figure 3:
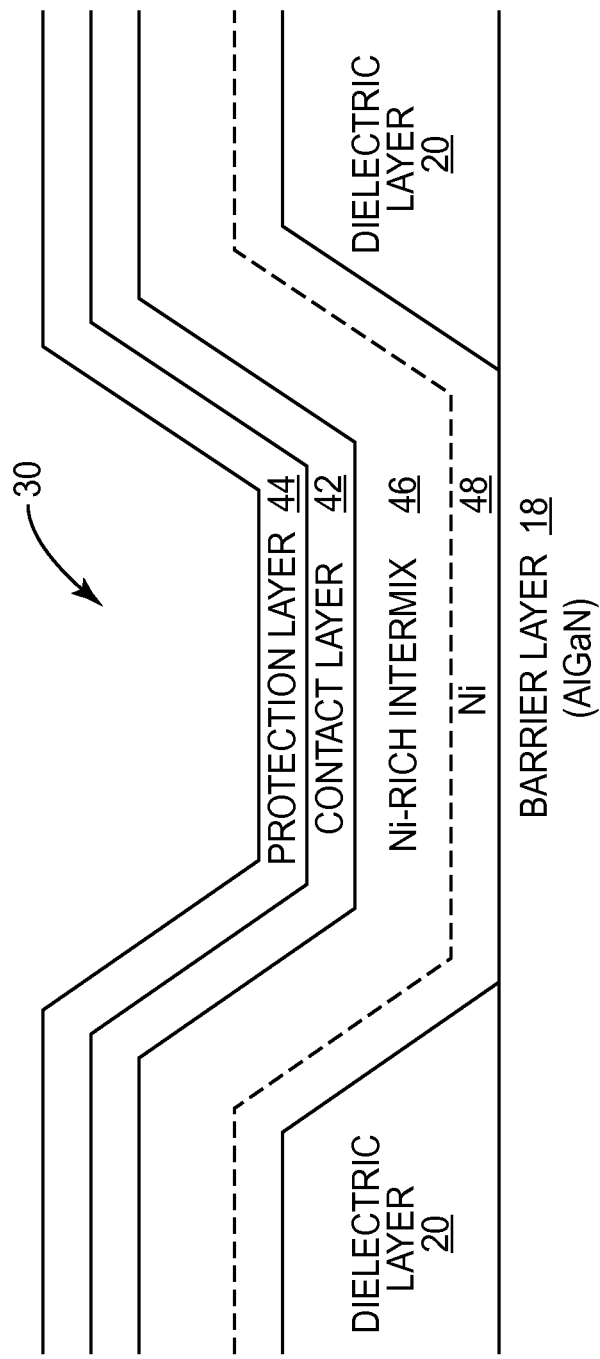
FIG. 3 illustrates the Ni-rich Schottky contact of FIG. 2 after intermixing of metals in the Ni-rich contact metal stack due to elevated temperatures according to one embodiment of the present disclosure.

FIGS. 2 and 3 provide further details regarding the Ni-rich Schottky contact 30 and an exemplary method of fabrication thereof according to one embodiment of the present disclosure. As illustrated in FIG. 2, in this embodiment, the Ni-rich Schottky contact 30 includes a Ni-rich contact metal stack 34. As used herein, "Ni-rich" refers to layer thickness rather than atomic composition. As illustrated, in this embodiment, the Ni-rich contact metal stack 34 includes a first Ni layer 36 deposited or otherwise formed on, and preferably directly on, the surface of the barrier layer 18 as well as the surface and sidewalls of the dielectric layer 20, an interlayer 38 deposited or otherwise formed on, and preferably directly on, a surface of the first Ni layer 36 opposite the barrier layer 18, and a second Ni layer 40 deposited or otherwise formed on, and preferably directly on, a surface of the interlayer 38 opposite the first Ni layer 36. The interlayer 38 is preferably formed of Platinum (Pt), but may be formed of other alternative materials such as, for example, Palladium (Pd) or Iridium (Ir). Note, however, that the interlayer 38 may include multiple layers of the same or different compositions. The Ni-rich Schottky contact 30 also includes a contact layer 42 deposited or otherwise formed on, and preferably directly on, a surface of the second Ni layer 40 opposite the interlayer 38 and a protection layer 44 deposited or otherwise formed on a surface of the contact layer 42 opposite the second Ni layer 40. The contact layer 42 is preferably formed of gold (Au), but is not limited thereto. The protection layer 44 is preferably formed of Titanium (Ti), but is not limited thereto. Notably, in this embodiment, the interlayer 38 operates as a barrier layer to prevent or substantially reduce diffusion of metal atoms from the contact layer 42 into the first Ni layer 36.

In order for the Ni-rich contact metal stack 34 to be Ni-rich, a ratio of a total thickness of the first and second Ni layers 36 and 40 to a thickness of the interlayer 38 is greater than 1, more preferably greater than 2, more preferably greater than 3, and more preferably approximately equal to 3.33 (i.e., 10/3). In one embodiment, the ratio of the total thickness of the first and second Ni layers 36 and 40 over the thickness of the interlayer 38 is in a range of 1.01 to 10, more preferably in a range of 2 to 10, more preferably in a range of 3 to 10, and more preferably in a range of 3 to 4. In one embodiment, the thickness of the first Ni layer 36 is in a range of and including 100 to 300 Angstroms, the thickness of the interlayer 38 is in a range of and including 50 to 200 Angstroms, and a thickness of the second Ni layer 40 is in a range of and including 50 to 250 Angstroms. Note, however, that the thicknesses of the layers 36, 38, and 40 are selected from these ranges such that the Ni-rich contact metal stack 34 is Ni-rich.

FIG. 3 illustrates the Ni-rich Schottky contact 30 of FIG. 2 after the Ni-rich Schottky contact 30 has been exposed to elevated fabrication temperatures (e.g., annealing) and/or elevated operational temperatures. As illustrated, the first Ni layer 36, the interlayer 38, and the second Ni layer 40 in the Ni-rich contact metal stack 34 intermix to provide a Ni-rich intermix layer 46. Preferably, the thickness of the first Ni layer 36 in the Ni-rich contact metal stack 34 (FIG. 2) is large enough that, even after intermixing, the Ni-rich intermix layer 46 includes a residual Ni layer 48 on, and preferably directly on, the surface of the barrier layer 18. The residual Ni layer 48 forms a Schottky layer of the Ni-rich Schottky contact 30.

Figure 4:
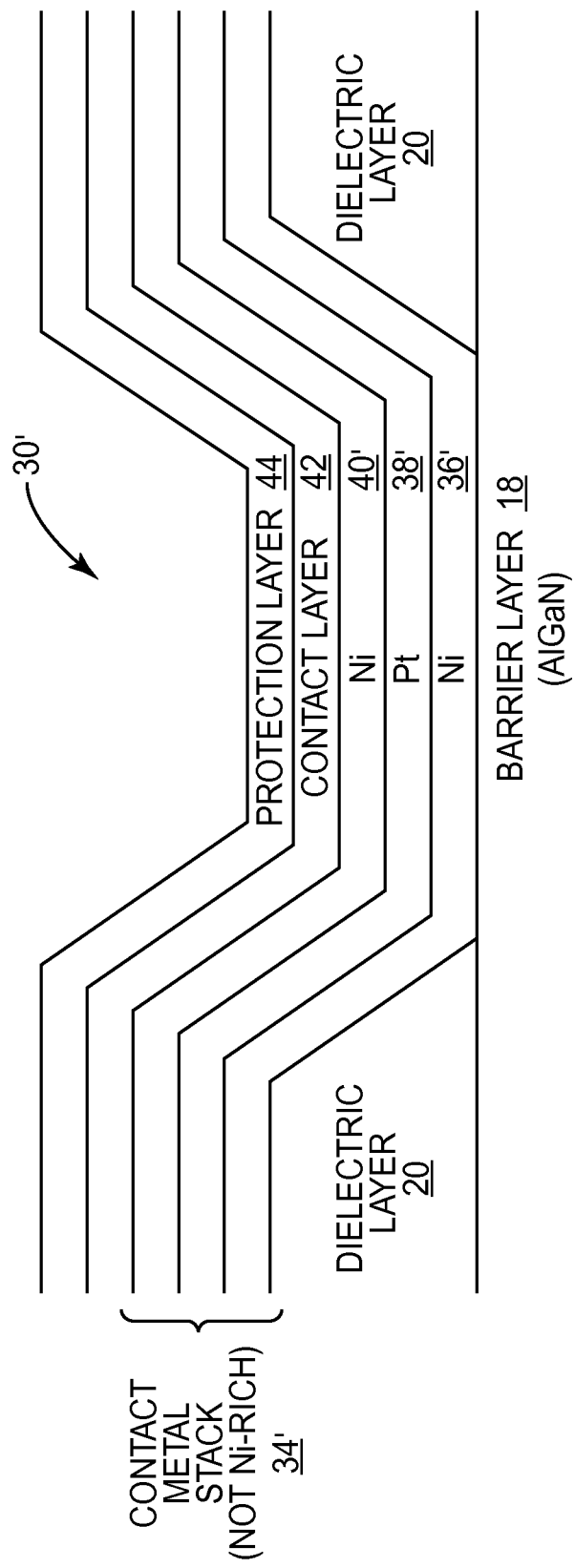
FIG. 4 illustrates a Schottky contact that is similar to that of FIG. 2 but is not Ni-rich.
Figure 5:
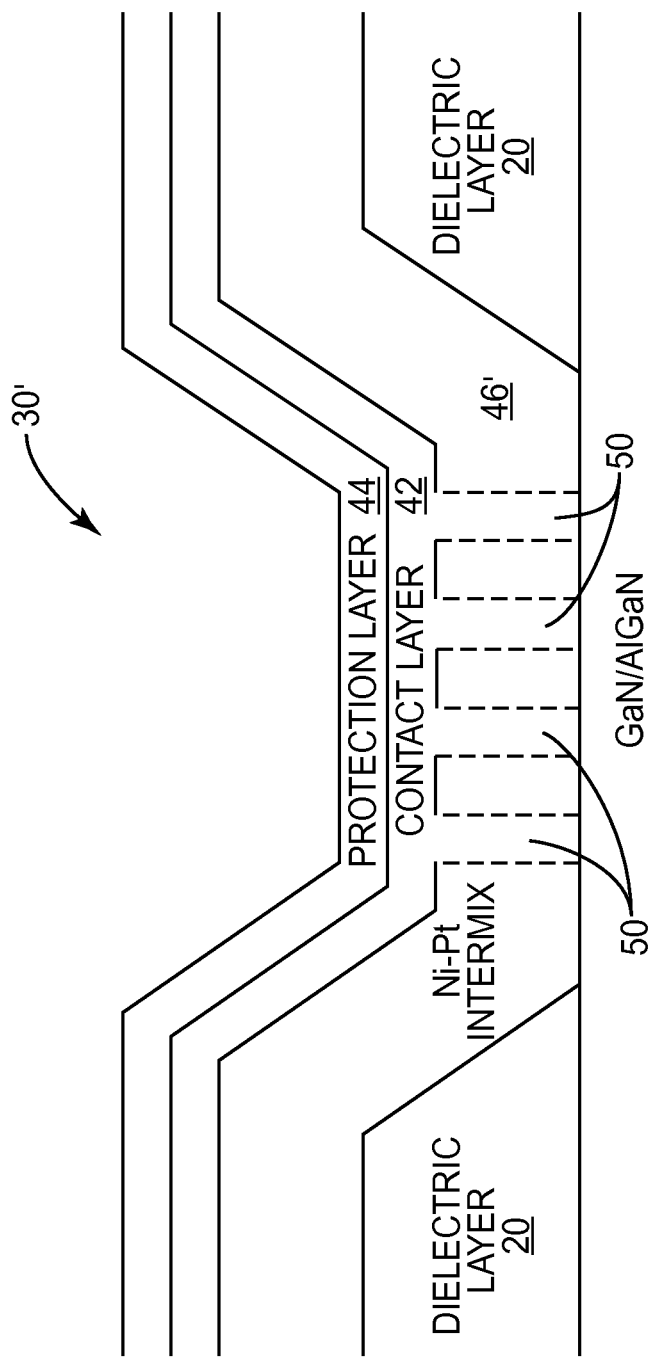
FIG. 5 illustrates the Schottky contact of FIG. 4 after intermixing of metals in the contact metal stack at elevated temperatures, wherein voids are formed in the contact metal stack and lead to increased leakage and early device failure.

Because the Ni-rich contact metal stack 34 of FIG. 2 is Ni-rich, the inventors have found that voids that would otherwise form in the contact metal stack 34 due to intermixing of the metal layers at elevated fabrication and/or operational temperatures are eliminated or at least substantially reduced. As a result, leakage through the Ni-rich Schottky contact 30 is substantially less than that of a similar Schottky contact that is not Ni-rich. More specifically, FIGS. 4 and 5 illustrate a Schottky contact 30' that is substantially the same as the Ni-rich Schottky contact 30 of FIGS. 2 and 3 but where the Schottky contact 30' is not Ni-rich. As illustrated in FIG. 4, the Schottky contact 30' includes a contact metal stack 34', which includes a first Ni layer 36', an interlayer 38', and a second Ni layer 40' arranged as shown. The layers 36', 38', and 40' are the same as the layers 36, 38, and 40 of FIG. 2 but where the thicknesses of the layers 36', 38', and 40' are such that the contact metal stack 34' is not Ni-rich. As a result, after exposing the Schottky contact 30' to elevated fabrication and/or operational temperatures, intermixing of the layers 36', 38', and 40' results in an intermix layer 46' that includes voids 50 due to migration of Ni atoms, as shown in FIG. 5. The voids 50 result in increased leakage and, therefore, early failure of the device. The inventors have found that by using the Ni-rich contact metal stack 34 of FIG. 2, these voids 50 are eliminated or substantially reduced, which in turn eliminates or substantially reduces leakage.

Figure 6:
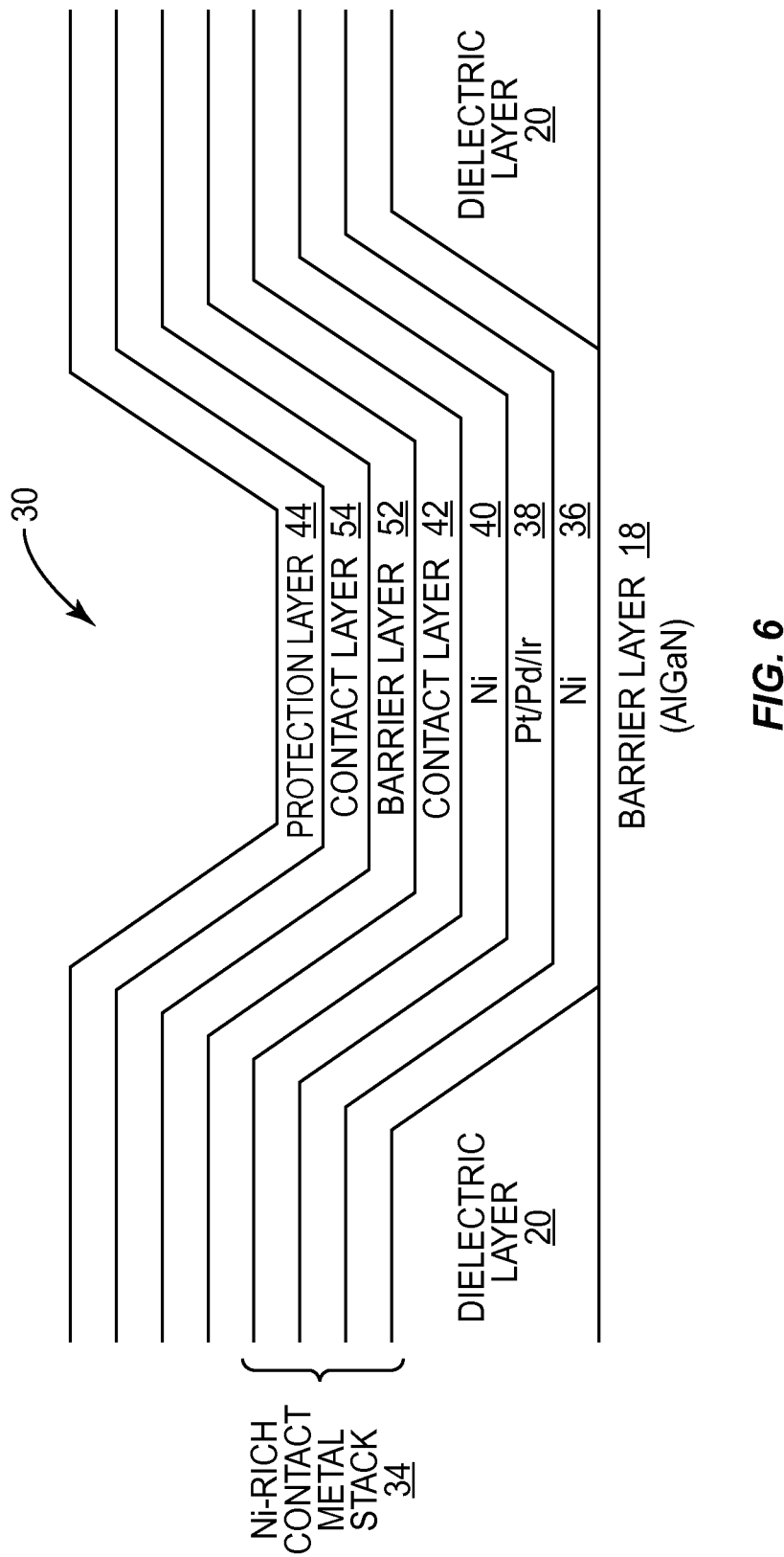
FIG. 6 illustrates the Ni-rich Schottky contact of FIG. 1 in more detail according to another embodiment of the present disclosure in which the Ni-rich Schottky contact includes a Ni-rich contact metal stack including a first Ni layer, an interlayer, and a second Ni layer.
Figure 7:
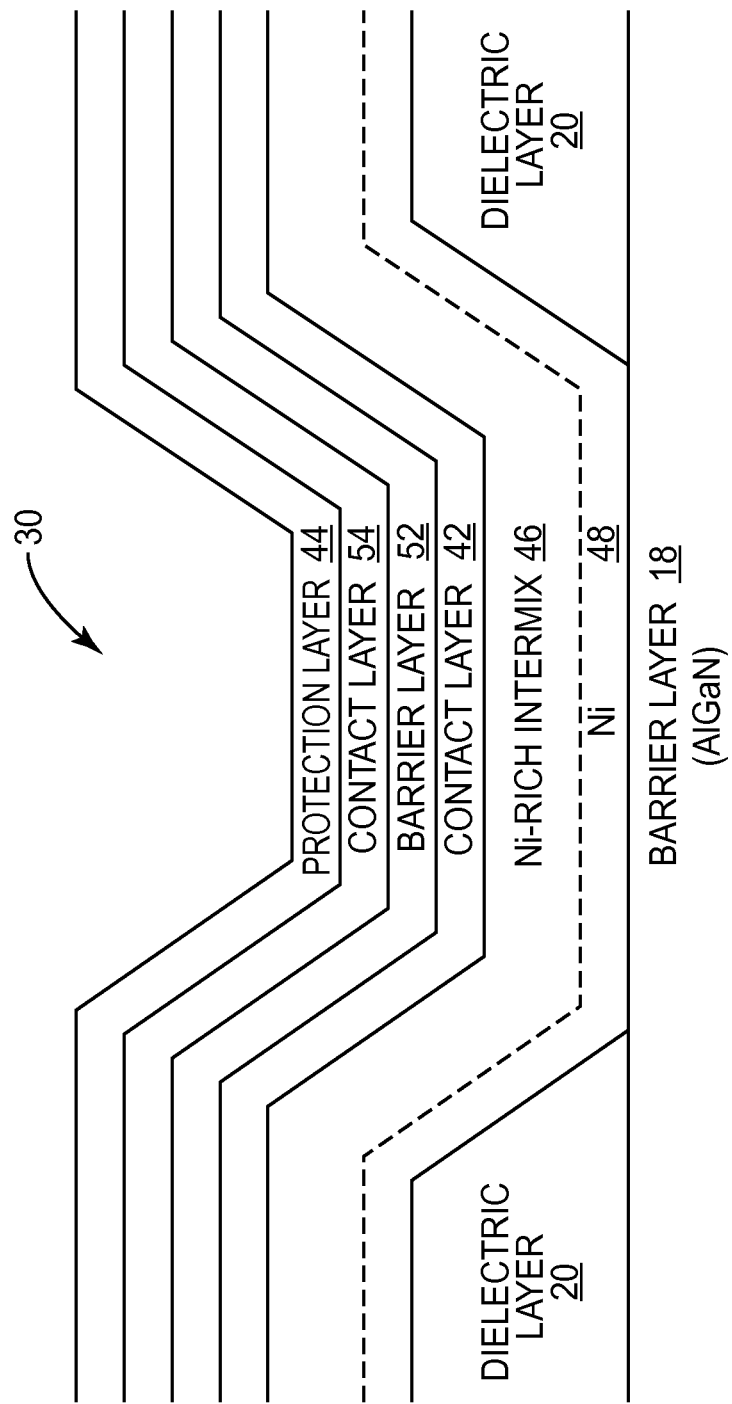
FIG. 7 illustrates the Ni-rich Schottky contact of FIG. 6 after intermixing of metals in the Ni-rich contact metal stack due to elevated temperatures according to one embodiment of the present disclosure.

FIGS. 6 and 7 illustrate the Ni-rich Schottky contact 30 and an exemplary method of fabrication thereof according to another embodiment of the present disclosure. As illustrated in FIG. 6, the Ni-rich Schottky contact 30 includes the Ni-rich contact metal stack 34 as discussed above. However, in this embodiment, a diffusion barrier layer 52 and a second contact layer 54 are included between the contact layer 42 and the protection layer 44 as shown. More specifically, the contact layer 42 is deposited or otherwise formed on, and preferably directly on, the surface of the second Ni layer 40 opposite the interlayer 38, the diffusion barrier layer 52 is deposited or otherwise formed on, and preferably directly on, the surface of the contact layer 42 opposite the second Ni layer 40, the second contact layer 54 is deposited or otherwise formed on, and preferably directly on, a surface of the diffusion barrier layer 52 opposite the contact layer 42, and the protection layer 44 is deposited or otherwise formed on, and preferably directly on, a surface of the second contact layer 54 opposite the diffusion barrier layer 52. The diffusion barrier layer 52 is preferably formed of Pt or Ni, but may alternatively be other metals such as, for example, Pd or Ir. The second contact layer 54 is preferably formed of Au but is not limited thereto.

FIG. 7 illustrates the Ni-rich Schottky contact 30 of FIG. 6 after the Ni-rich Schottky contact 30 has been exposed to elevated fabrication temperatures (e.g., annealing) and/or elevated operational temperatures. As illustrated, the first Ni layer 36, the interlayer 38, and the second Ni layer 40 in the Ni-rich contact metal stack 34 intermix to provide the Ni-rich intermix layer 46, as discussed above. Preferably, the thickness of the first Ni layer 36 in the Ni-rich contact metal stack 34 is large enough that, even after intermixing, the Ni-rich intermix layer 46 includes the residual Ni layer 48 on, and preferably directly on, the surface of the barrier layer 18. The residual Ni layer 48 forms a Schottky layer of the Ni-rich Schottky contact 30. Again, because the Ni-rich contact metal stack 34 of FIG. 6 is Ni-rich, the inventors have found that voids that would otherwise form in the Ni-rich contact metal stack 34 due to intermixing of the metal layers at elevated fabrication and/or operational temperatures is eliminated or at least substantially reduced. As a result, leakage is significantly reduced and, therefore, device failure resulting from gate leakage is avoided.

Figure 8:
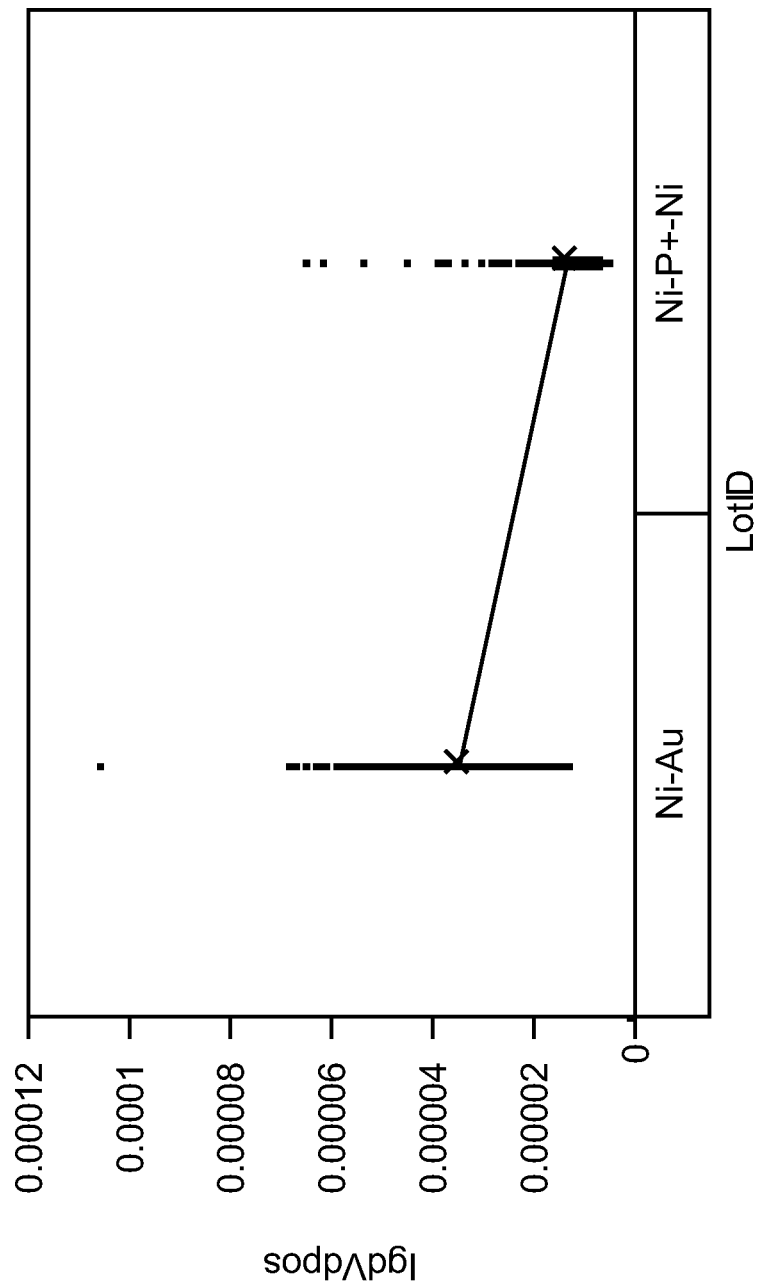
FIG. 8 graphically illustrates gate leakage improvement provided by one embodiment of the Ni-rich Schottky contact of the present disclosure.

FIG. 8 graphically illustrates improvement in gate leakage provided by one embodiment of the Ni-rich Schottky contact 30 of the present disclosure. As illustrated, in this embodiment, the Ni-rich Schottky contact 30 provides a 50% improvement in gate leakage over a conventional Nickel-Gold Schottky contact.

Again, it should be noted the Ni-rich Schottky contact 30 has been described above with respect to the HEMT 10 of FIG. 1, the Ni-rich Schottky contact 30 can be used as a Schottky contact to a semiconductor body (e.g., a Group III nitride semiconductor body) of other types of RF and/or power devices. Some exemplary RF and/or power devices for which the Ni-rich Schottky contact 30 can be used include, but are not limited to, Schottky diodes, MESFETs, GaN power switches, and the like.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
    a semiconductor body; and
    a Nickel-rich Schottky contact on a surface of the semiconductor body, the Nickel-rich Schottky contact comprising a Nickel-rich contact metal stack;
    wherein the Nickel-rich contact metal stack comprises:
        a first Nickel layer directly on the surface of the semiconductor body;
        an interlayer directly on a surface of the first Nickel layer opposite the semiconductor body; and
        a second Nickel layer directly on a surface of the interlayer opposite the first Nickel layer;
    wherein a ratio of a total thickness of the first Nickel layer and the second Nickel layer to a thickness of the interlayer is greater than 3.

2. The semiconductor device of claim 1 wherein the interlayer is a Platinum layer.

3. The semiconductor device of claim 1 wherein the interlayer is a Palladium layer.

4. The semiconductor device of claim 1 wherein the interlayer is an Iridium layer.

5. The semiconductor device of claim 1, wherein a material for the interlayer is selected from one of Platinum, Palladium, or Iridium.

6. The semiconductor device of claim 5 wherein a thickness of the interlayer is in a range of and including 50 to 200 Angstroms.

7. The semiconductor device of claim 5 wherein the ratio of the total thickness of the first Nickel layer and the second Nickel layer to the thickness of the interlayer is approximately equal to 3.33.

8. The semiconductor device of claim 5 wherein the ratio of the total thickness of the first Nickel layer and the second Nickel layer to the thickness of the interlayer is in a range of and including 3 to 10.

9. The semiconductor device of claim 5 wherein the ratio of the total thickness of the first nickel layer and the second nickel layer to the thickness of the interlayer is in a range of and including 3 to 4.

10. The semiconductor device of claim 5 wherein a thickness of the first Nickel layer is in a range of and including 100 to 300 Angstroms, the thickness of the interlayer is in a range of and including 50 to 180 Angstroms, and a thickness of the second Nickel layer is in a range of and including 50 to 250 Angstroms.

11. The semiconductor device of claim 5 wherein the Nickel-rich Schottky contact further comprises a contact layer directly on a surface of the second Nickel layer opposite the interlayer.

12. The semiconductor device of claim 11 wherein the contact layer is a Gold layer.

13. The semiconductor device of claim 11 wherein the Nickel-rich Schottky contact further comprises a protection layer directly on a surface of the contact layer opposite the second Nickel layer.

14. The semiconductor device of claim 13 wherein the protection layer is a Titanium layer.

15. The semiconductor device of claim 13 wherein the contact layer is a Gold layer, and the protection layer is a Titanium layer.

16. The semiconductor device of claim 5 wherein the Nickel-rich Schottky contact further comprises:
    a first contact layer directly on a surface of the second Nickel layer opposite the interlayer;
    a barrier layer on a surface of the first contact layer opposite the second Nickel layer; and
    a second contact layer on a surface of the barrier layer opposite the first contact layer.

17. The semiconductor device of claim 16 wherein the barrier layer is a Platinum layer.

18. The semiconductor device of claim 17 wherein the first and second contact layers are Gold layers.

19. The semiconductor device of claim 16 wherein the barrier layer is a Nickel layer.

20. The semiconductor device of claim 19 wherein the first and second contact layers are Gold layers.

21. The semiconductor device of claim 5 wherein the semiconductor body comprises one or more Group III nitride epitaxial layers.

22. The semiconductor device of claim 21 wherein the one or more Group III nitride epitaxial layers comprise at least one of a group consisting of: a Gallium Nitride layer and an Aluminum Gallium Nitride layer.

23. The semiconductor device of claim 21 further comprising a Silicon Carbide substrate, wherein the semiconductor body is on a surface of the Silicon Carbide substrate.

24. The semiconductor device of claim 5 wherein the semiconductor device is a radio frequency power device.

25. The semiconductor device of claim 5 wherein the semiconductor device is a radio frequency device.

26. The semiconductor device of claim 5 wherein the semiconductor device is a power device.

27. A semiconductor device comprising:
    a semiconductor body; and
    a Schottky contact on a surface of the semiconductor body, the Schottky contact comprising:
        a first Nickel layer directly on the surface of the semiconductor body;
        an interlayer directly on a surface of the first Nickel layer opposite the semiconductor body; and
        a second Nickel layer directly on a surface of the interlayer opposite the first Nickel layer;
        wherein the interlayer comprises a transition metal other than Nickel.

28. The semiconductor device of claim 27 wherein a ratio of a total thickness of the first Nickel layer and the second Nickel layer to a thickness of the interlayer is greater than 1.

* * * * *